United States Patent
Sparks et al.

(10) Patent No.: US 7,351,603 B2
(45) Date of Patent: *Apr. 1, 2008

(54) PROCESS OF MAKING A MICROTUBE AND MICROFLUIDIC DEVICES FORMED THEREWITH

(75) Inventors: Douglas Ray Sparks, Whitmore Lake, MI (US); Nader Najafi, Ann Arbor, MI (US)

(73) Assignee: Integrated Sensing Systems, Inc., Ypsilanti, MI (US)

( * ) Notice: Subject to any disclaimer, the term of this patent is extended or adjusted under 35 U.S.C. 154(b) by 325 days.

This patent is subject to a terminal disclaimer.

(21) Appl. No.: 11/161,901

(22) Filed: Aug. 22, 2005

(65) Prior Publication Data

US 2006/0037187 A1 Feb. 23, 2006

Related U.S. Application Data

(60) Provisional application No. 60/603,156, filed on Aug. 20, 2004.

(51) Int. Cl.
*H01L 21/00* (2006.01)

(52) U.S. Cl. .................... 438/50; 438/51; 438/52; 438/53; 438/456; 257/E21.001

(58) Field of Classification Search ........... 438/50–53, 438/456; 257/E21.001
See application file for complete search history.

(56) References Cited

U.S. PATENT DOCUMENTS

| | | | | |
|---|---|---|---|---|
| 4,975,390 A | * | 12/1990 | Fujii et al. | 438/53 |
| 5,543,349 A | * | 8/1996 | Kurtz et al. | 438/51 |
| 6,477,901 B1 | * | 11/2002 | Tadigadapa et al. | 73/861.352 |
| 6,647,778 B2 | | 11/2003 | Sparks | 73/204.26 |
| 6,935,010 B2 | * | 8/2005 | Tadigadapa et al. | 29/592.1 |
| 2006/0175303 A1 | * | 8/2006 | Sparks et al. | 219/121.43 |

* cited by examiner

*Primary Examiner*—Michael Lebentritt
*Assistant Examiner*—Angel Roman
(74) *Attorney, Agent, or Firm*—Hartman & Hartman, PC; Gary M. Hartman; Domenica N. S. Hartman

(57) ABSTRACT

A process for producing a tube suitable for microfluidic devices. The process uses a uniformly-doped first material having a first portion into which a channel is etched partially through the first material between second and third portions of the first material. The first material is then bonded to a second material so that a first portion of the second material overlies the first portion of the first material and encloses the channel to define a passage. The second and third portions of the second material and part of the second and third portions of the first material are then removed, and the first portion of the second material is bonded to a substrate such that the passage projects over a recess in the substrate surface. The second and third portions of the first material are then removed to define a tube with a freestanding portion.

20 Claims, 4 Drawing Sheets

PROCESS OF MAKING A MICROTUBE AND MICROFLUIDIC DEVICES FORMED THEREWITH

CROSS REFERENCE TO RELATED APPLICATIONS

This application claims the benefit of U.S. Provisional Application No. 60/603,156, filed Aug. 20, 2004.

BACKGROUND OF THE INVENTION

The present invention generally relates to micromachining processes and devices formed thereby. More particularly, this invention relates to a process of forming a micromachined tube suitable for a microfluidic device.

Processes for fabricating resonant mass flow and density sensors using silicon micromachining techniques are disclosed in commonly-assigned U.S. Pat. Nos. 6,477,901 and 6,647,778. As used herein, micromachining is a technique for forming very small elements by bulk etching a substrate (e.g., a silicon wafer), and/or by surface thin-film etching, the latter of which generally involves depositing a thin film (e.g., polysilicon or metal) on a sacrificial layer (e.g., oxide layer) on a substrate surface and then selectively removing portions of the sacrificial layer to free the deposited thin film. In the processes disclosed in U.S. Pat. Nos. 6,477,901 and 6,647,778, wafer bonding and etching techniques are used to produce a micromachined tube supported above a surface of a substrate. The tube can be vibrated at resonance, by which the flow rate, density, and/or other properties or parameters of a fluid flowing through the tube can be measured.

According to one embodiment of U.S. Pat. No. 6,477,901, a tube is formed using p-type doped layers and selective etching techniques. The doped layers form the walls of the tube, and therefore determine and limit the size of the tube walls as well as the cross-sectional dimensions of the tube. According to another embodiment of U.S. Pat. No. 6,477,901, a tube is formed with the use of a silicon-on-insulator (SOI) wafer. The buried oxide layer of the SOI wafer is used as an etch stop in a manner that determines and can limit the thickness of the tube. Another consideration of this embodiment is the higher cost of SOI silicon wafers as compared to standard silicon wafers.

In view of the above, while well suited for producing micromachined tubes for microfluidic devices, it would be advantageous if other micromachining processes were available that avoid the size restraints of previous processes, as well as potentially simplify processing and reduce cost and processing time.

BRIEF SUMMARY OF THE INVENTION

The present invention provides a process for producing a micromachined tube suitable for microfluidic devices. While resonating tubes for mass flow and density sensors of the types disclosed in U.S. Pat. Nos. 6,477,901 and 6,647,778 are notable examples, other tubular structures within the scope of this invention include stationary tubes, diaphragms, and channels for such microfluidic devices as needles, cannula, pressure sensors, temperature sensors, motion sensors, drug infusion devices, and other devices that can employ microtubes.

The process of this invention entails the use of a first material having a thickness throughout which the first material is substantially uniformly doped. A channel is etched in a first portion of the first material in a direction of the thickness thereof. The channel is etched to extend not entirely through the thickness of the first material, through preferably through more than half the thickness, and is between second and third portions of the first material. The first material is then bonded to a second material so that a first portion of the second material overlies the first portion of the first material and encloses the channel therein to define a passage, and so that the second and third portions of the second material overlie the second and third portions of the first material. The second and third portions of the second material and some but not all of the second and third portions of the first material underlying the second and third portions of the second material are then removed, such that the first portions of the first and second materials define a protrusion. The first portion of the second material is then bonded to a substrate adjacent a recess in a surface of the substrate such that a portion of the passage projects over the recess. Finally, the second and third portions of the first material are removed such that the first portion of the first material and the passage therein define a tube, and a free-standing portion of the tube projects over the recess in the substrate so as to be capable of movement relative thereto.

In view of the above, it can be seen that the depth and width of the channel in the first material determine the height and width, respectively, of the passage within the tube, and the remaining thickness of the first material following etching of the channel determines the thickness of one of the walls of the tube. Therefore, the height of the tube passage and the thickness of the tube walls are not limited by doped layers or buried oxide layers on or within the first material, permitting the micromachining of larger tubes. Larger tubes produced by this process achieve lower pressure drops and permit higher flow rates within microfluidic systems containing the tubes, without necessitating an increase in the in-plane (width) dimensions of the tube or the substrate carrying the tube. As such, the invention enables tube passage dimensions to be increased vertically (with or without an increase in in-plane dimensions) to achieve higher flow rates, and if horizontal dimensions are held constant can achieve higher flow rates without an increase in chip size, and in some cases while even permitting smaller chip sizes. The elimination of SOI wafers in the manufacturing process is another advantage of the present invention.

Other objects and advantages of this invention will be better appreciated from the following detailed description.

DETAILED DESCRIPTION OF THE INVENTION

FIGS. 1 through 9 represent steps in a process carried out to produce a micromachined tube (40 in FIGS. 8 and 9) suitable for a variety of microfluidic devices. It should be noted that the drawings are drawn for purposes of clarity when viewed in combination with the following description, and therefore are not necessarily to scale.

Figure 1:
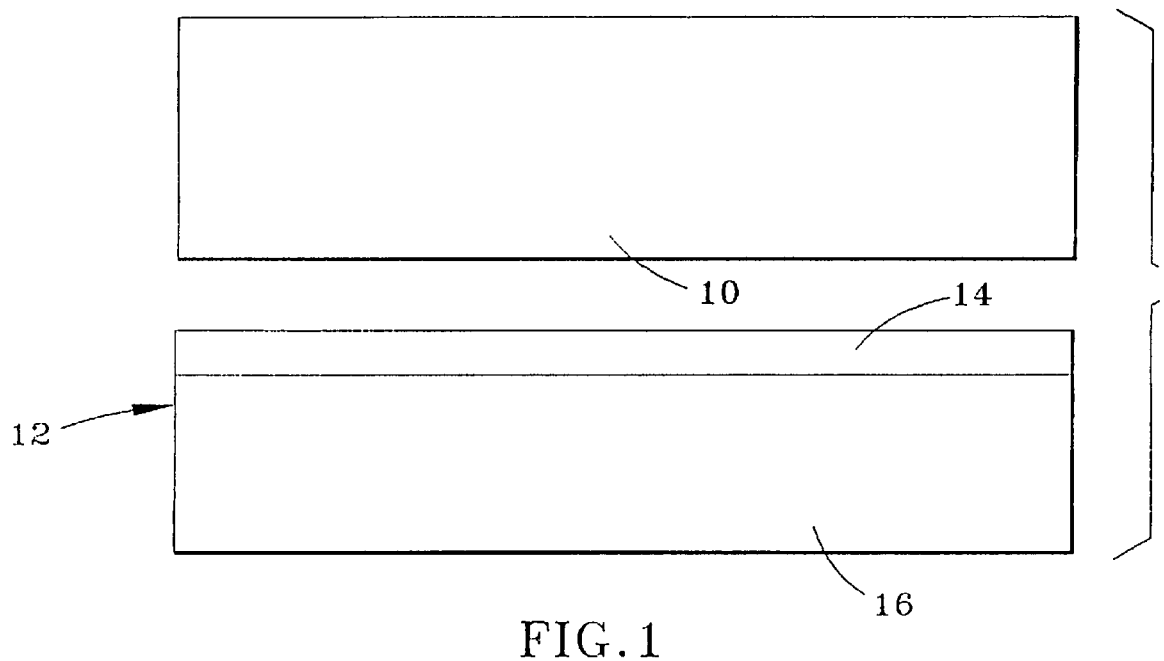
FIG. 1 show cross-sectional views of a uniformly-doped first wafer and a second wafer with an epitaxial layer used to produce a micromachined tube in accordance with an embodiment of this invention.

FIG. 1 depicts a pair of wafers 10 and 12 (only a single chip region of which are shown for convenience) selected for processing in accordance with the invention. The wafers 10 and 12 are both preferably silicon, though other materials can be used. The wafer 10 is preferably of constant doping throughout its thickness to permit a uniform rate of etching of the wafer 10, as discussed below. The type (n or p-type) and doping level can be tailored as may be required or desired by one skilled in the art. Heavy p-type doping (e.g., with boron, aluminum, or gallium) is preferred for improving etching and corrosion resistance, though lighter doping can be used to enable the wafer 10 to be more readily inspected for defects by infrared (IR) radiation. While silicon is preferred, the wafer 10 can be formed from materials that include but are not limited to Ge, SiC, GaAs, Si/Ge, sapphire, glass, ceramic materials, and metallic materials, and can be single crystal or polycrystalline. The thickness of the wafer 10 will typically vary from about 100 to about 1500 micrometers. According to a preferred aspect of the invention, the thickness of the wafer 10 determines the height dimensions of the tube 40 (dimensions measured in a direction normal to the wafer surface). As such, a particularly suitable thickness is about 500 micrometers.

The second wafer 12 is represented as an epitaxial wafer, in which an epitaxial layer 14 is supported on a substrate 16, though it is foreseeable that a SOI wafer or doped single-crystal wafer could be used instead. The epitaxial layer 14 is can be doped similar in type and level to the wafer 10. For example, in FIG. 1 the wafer 10 and the epitaxial layer 14 are represented as being doped P+. While an epitaxial layer 14 is shown and preferred, it could be replaced by a diffused layer, a boron or B/Ge doped layer, or a buried doped layer, as will be appreciated by those skilled in the art. From the following discussion it will become evident that the epitaxial layer 14 establishes the thickness of one wall of the tube 40. Therefore, suitable thicknesses for the epitaxial layer 14 will depend on the desired thickness of the tube walls, which in turn will depend on the particular application for the tube 40. The substrate 16 supports the epitaxial layer 14 during initial process, and as such its thickness and doping level are not critical to the invention.

Figure 2:
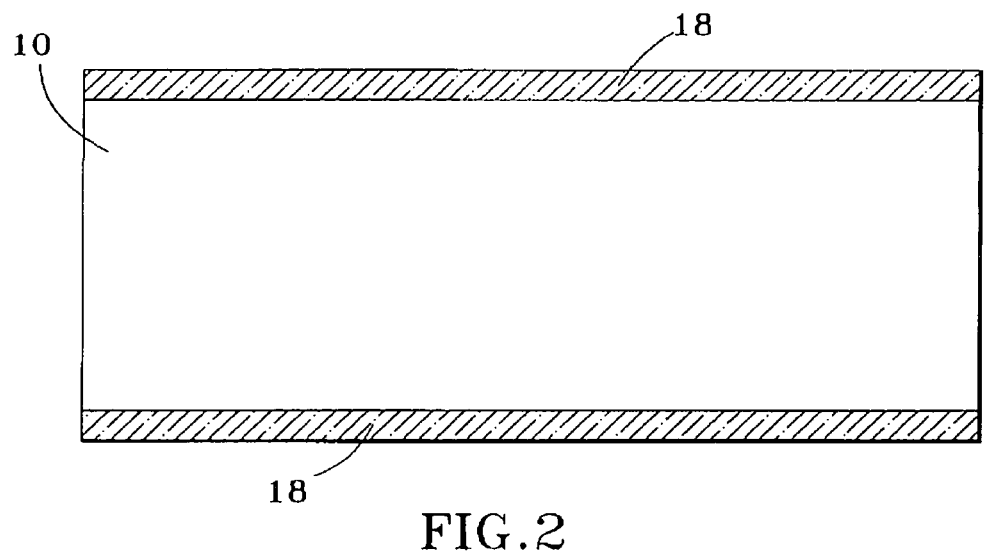
FIGS. 2 and 3 depict masking and etching steps performed on the first wafer of FIG. 1 to form a channel in the first wafer.
Figure 3:
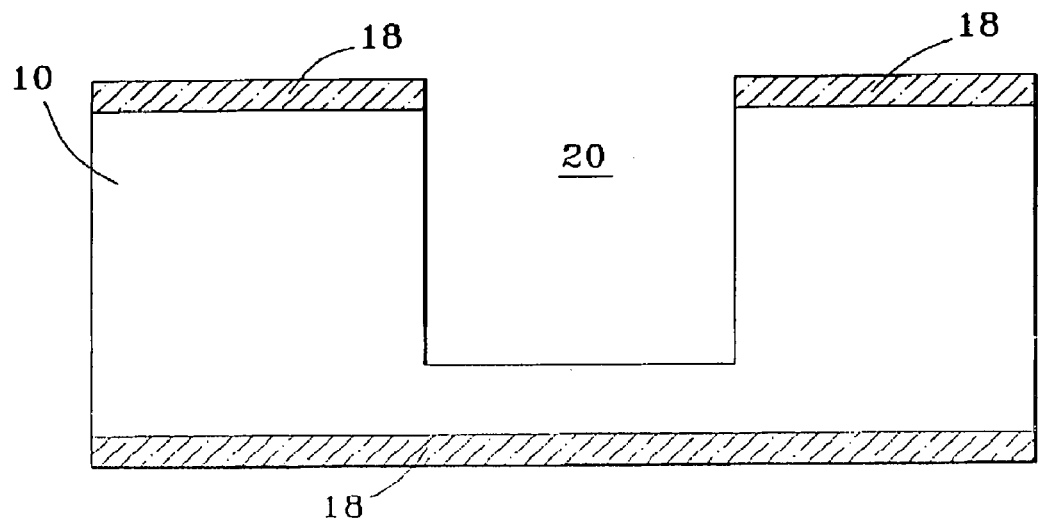

FIG. 2 shows the wafer 10 as being provided with masks 18 to protect its surfaces from attack during an etching step, the result of which is shown in FIG. 3. The masks 18 can be formed by depositing or growing an oxide on the surfaces of the wafer 10, though other materials known in the art can be used to mask the wafer 10. FIG. 3 shows the result of removing a portion of one of the masks 18 and then etching a channel 20 into the wafer 10. To obtain the roughly rectilinear cross-section shown for the channel 20, a preferred etching technique is to use a plasma that is anisotropic, in some cases via sidewall deposition. This type of vertical etching is known as reactive ion etching (RIE), dry etching, or deep reactive ion etching (DRIE), as well known in the art. An alternative method of forming the desired vertical/straight sidewalls of the channel 20 is to form the wafer 10 of a (110) oriented silicon and use a wet etch technique to form the channel 20. Throughout this description, wet etching is considered an alternative method to the etching steps that have been or will be noted.

As previously noted, the entire thickness of the wafer 10 is used to form the tube 40 and determines its height dimensions. Furthermore, the depth of the channel 20 determines the inner height dimension of the passage 36 (FIGS. 7 and 8) within the tube 40. As such, etching of the channel 20 is a generally long process, and preferably extends through about 75% to about 90% of the thickness of the wafer 10. As such, a tube passage 36 with a height of up to about 1350 micrometers is possible with this invention if a conventional silicon wafer (thickness of up to 1500 micrometers) is used.

Figure 4:
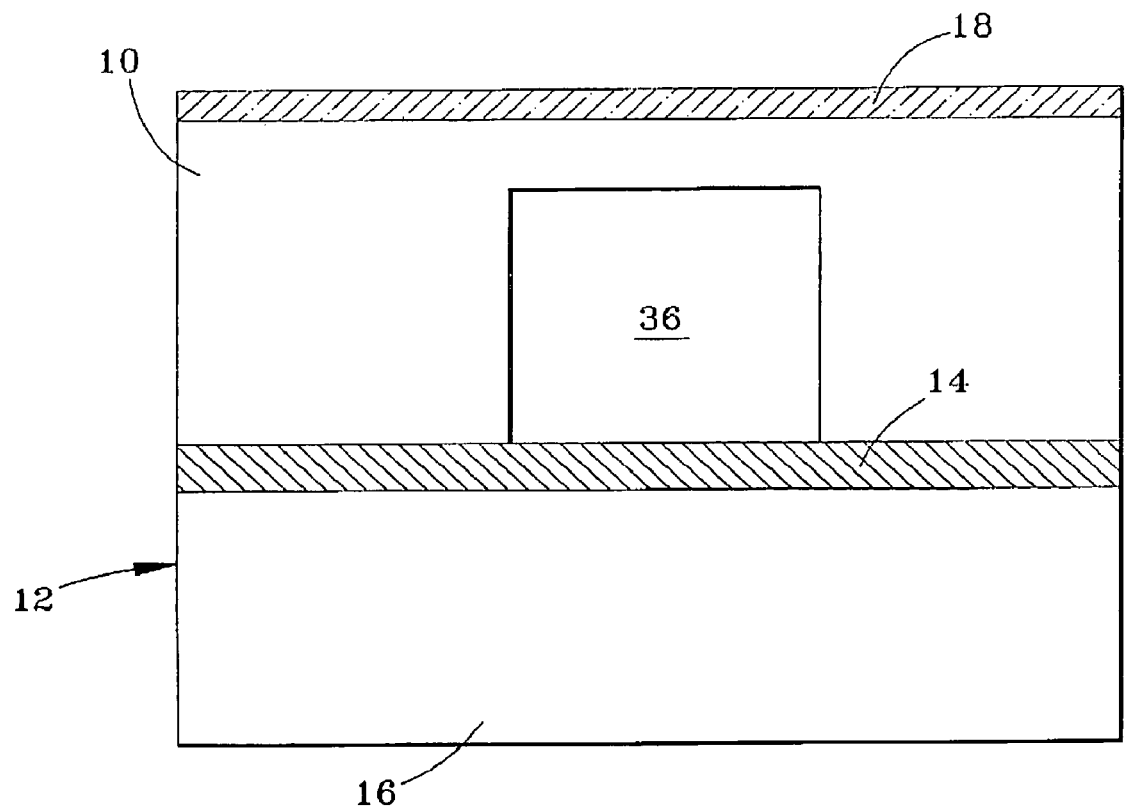
FIG. 4 depicts the result of bonding the first wafer of FIG. 3 to the second wafer of FIG. 1 to enclose the channel and form a passage within the first wafer.

FIG. 4 represents the result of cleaning and then bonding the wafer 10 to the epitaxial layer 14 of the wafer 12. Bonding can be accomplished with a variety of techniques, such as fusion, direct, anodic, solder, eutectic, and adhesive bonding. Silicon fusion bonding is the preferred method if the wafers 10 and 12 are formed of silicon, as this technique can be performed at room temperature under vacuum or at ambient pressures with a plasma assist mechanism. A high temperature anneal/oxidation can be employed to strengthen the silicon fusion bond.

Figure 5:
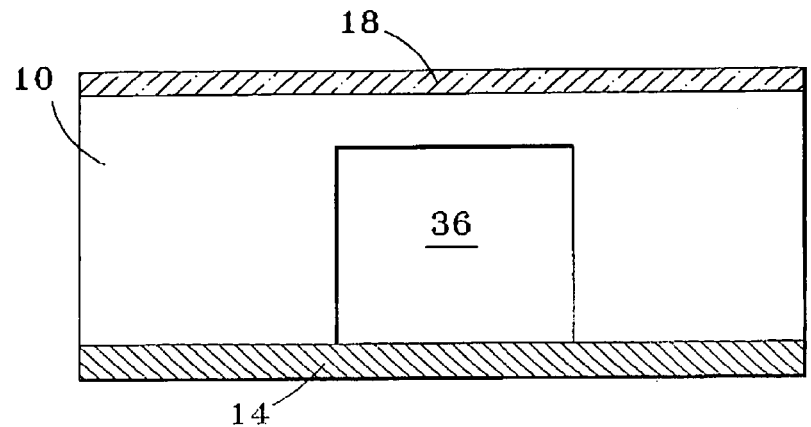
FIG. 5 depicts the result of removing all but the epitaxial layer of the second wafer.

FIG. 5 shows the lighter-doped substrate 16 of the epitaxial wafer 12 as having been removed, such as by lapping, polishing, grinding, wet or dry etching with an etchant selective to lightly-doped substrate 16, or a combination of these techniques. Selective etching that stops at the heavily-doped epitaxial layer 14 is preferred. In an alternative embodiment in which a SOI wafer is used as the material for the wafer 12, selective etching that stops at the buried oxide layer of the SOI wafer can be used.

Figure 6:
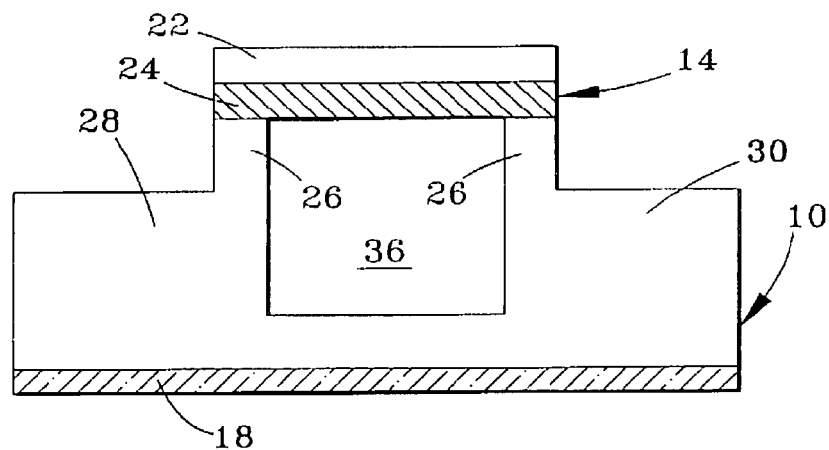
FIGS. 6 and 7 depict the results of removing the epitaxial layer and underlying portions of the first wafer to either side of the passage, and then bonding the remaining portion of the epitaxial layer to a substrate.

FIG. 6 shows the result of masking and etching the epitaxial layer 14 to define an outer wall 24 of the tube 40 and form portions of the sidewalls 26 of the tube 40. For this step, a resist mask 22 is represented as being employed, though other masking materials and techniques could foreseeably be used, such as an oxide layer, combination of resist and oxide layer, etc. As evident from FIG. 6, this etching step is used to etch entirely through the epitaxial layer 14 but only partially etch through the thickness of the wafer 10. As a result, the final depth of this etch is dependent on the total thickness of the epitaxial layer 14 and the wafer 10, and the strength desired for the remaining portion of the wafer 10. Leaving a significant amount of the thickness of the wafer 10 will enable the wafer stack to more readily survive manufacturing handling. For this reason, less than half the thickness of the side portions 28 and 30 of the wafer 10 are shown in FIG. 6 as having been etched away. For example, if the wafer 10 is about 500 micrometers in thickness, this etch might remove up to about 150 micrometers of the wafer 10.

Figure 7:
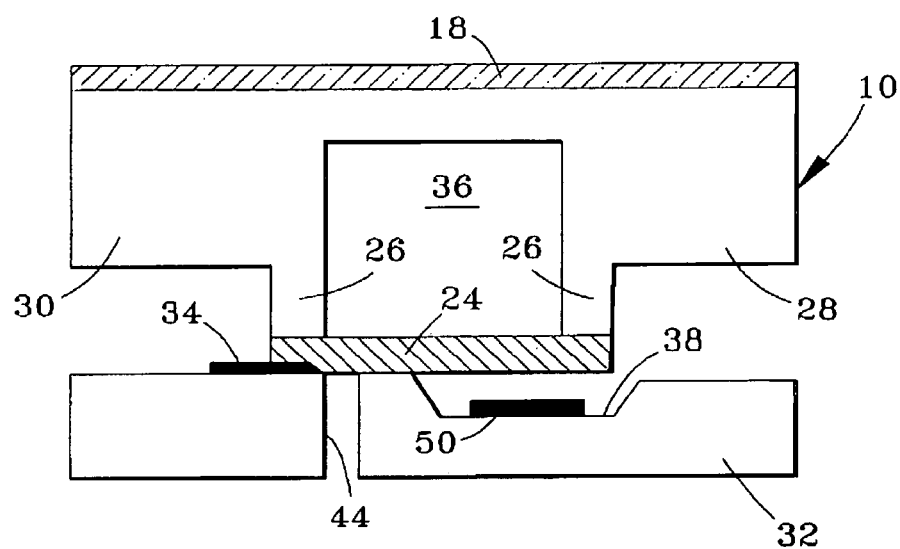

In FIG. 7, the wafer stack is shown as having been flipped and bonded to a micromachined and metallized substrate 32, such as Pyrex, borofloat, quartz, silicon, or other glass-type wafer. A variety of bonding techniques can be employed for this purpose, with anodic bonding being preferred. FIG. 7 shows the heavily-doped outer wall 24 (formed by the remnant of the epitaxial layer 14) as making electrical contact with a metal pattern 34 on the substrate 32 to enable electrical grounding or biasing of the tube 40. As a result of this step, a portion of the passage 36 formed when the channel 20 was closed by the epitaxial layer 14 is partially suspended above a recess 38 in the surface of the substrate 32. While inlet and outlet holes 44 (one of which is shown in FIG. 7) can be formed at this time by etching, such holes 44 can be formed during or after any of the following steps.

Figure 8:
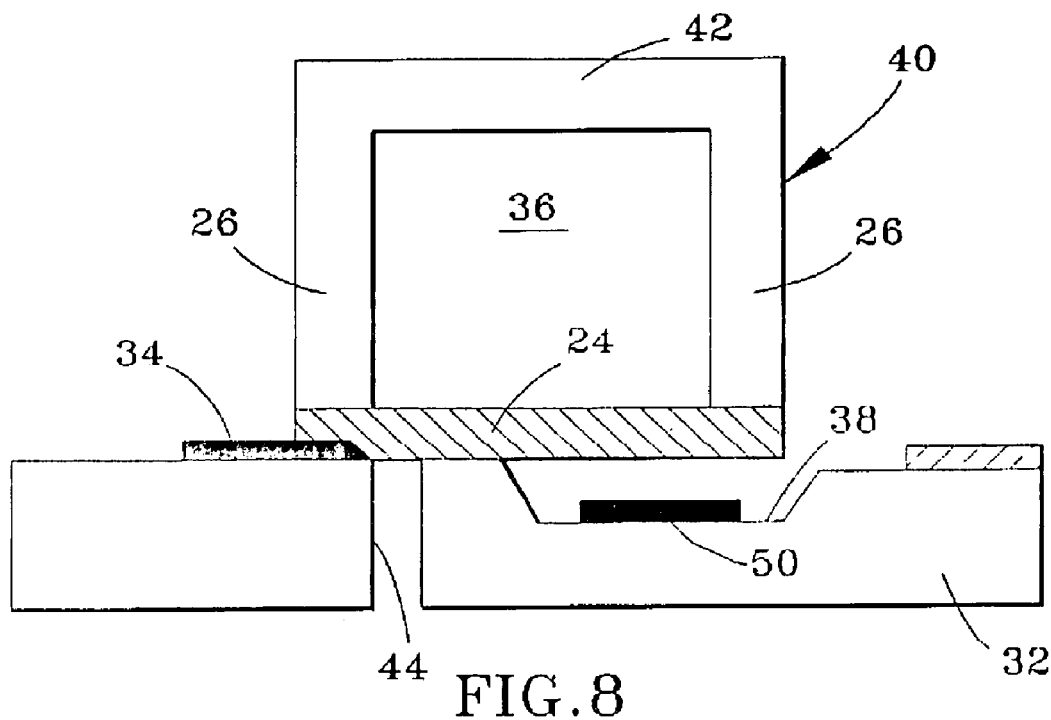
FIG. 8 depicts the result of removing the remaining underlying portions of the first wafer to yield a tube with a freestanding portion suspended over the substrate.

FIG. 8 shows the result of masking and etching the remainder of the wafer 10 to finish defining the tube 40 and its outer periphery, including its sidewalls 26 and its outer wall 42. For this process, a mask (not shown) can be aligned to the sidewalls 26 of the tube 40 (or to metallization or the recess 38 on the surface of the substrate 32) through the substrate 32 using double-side alignment tools known in the art. Alternatively, IR alignment can be employed. After alignment and development, the remaining outer portions 28 and 30 of the wafer 10 are removed, preferably by DRIE plasma etching. As an alternative method, a single plasma etch could be employed before or after bonding of the wafer stack to the substrate 32, and tabs or thick scribe street rims could be employed to mechanically reinforce the wafer 10 after etching prior to bonding.

The tube 40 can have a variety of shapes, including the U-shape (in plan view) of the resonating tubes of U.S. Pat. Nos. 6,477,901 and 6,647,778. If the tube 40 is intended to be vibrated, as is the case for the resonating tubes of U.S. Pat. Nos. 6,477,901 and 6,647,778, the portion of the tube 40 suspended above the recess 38 is a freestanding portion in which movement can be induced relative to the substrate 32. For this purpose, FIG. 8 shows a drive electrode 50 formed within the recess 38 for electrostatic coupling with the tube 40. Because the lower wall 24 of the tube 40 facing the electrode 50 is conductive as a result of being formed by the doped epitaxial layer 14, a separate electrode is not required on the tube 40 for electrostatically driving the freestanding portion of the tube 40 with the electrode 50. It should be noted that vibration or other desired movement of the tube 40 relative to the substrate 32 can be induced in the tube 40 by means other than electrostatically, such as piezoelectrically, piezoresistively, acoustically, ultrasonically, magnetically, optically, or another actuation technique.

Figure 9:
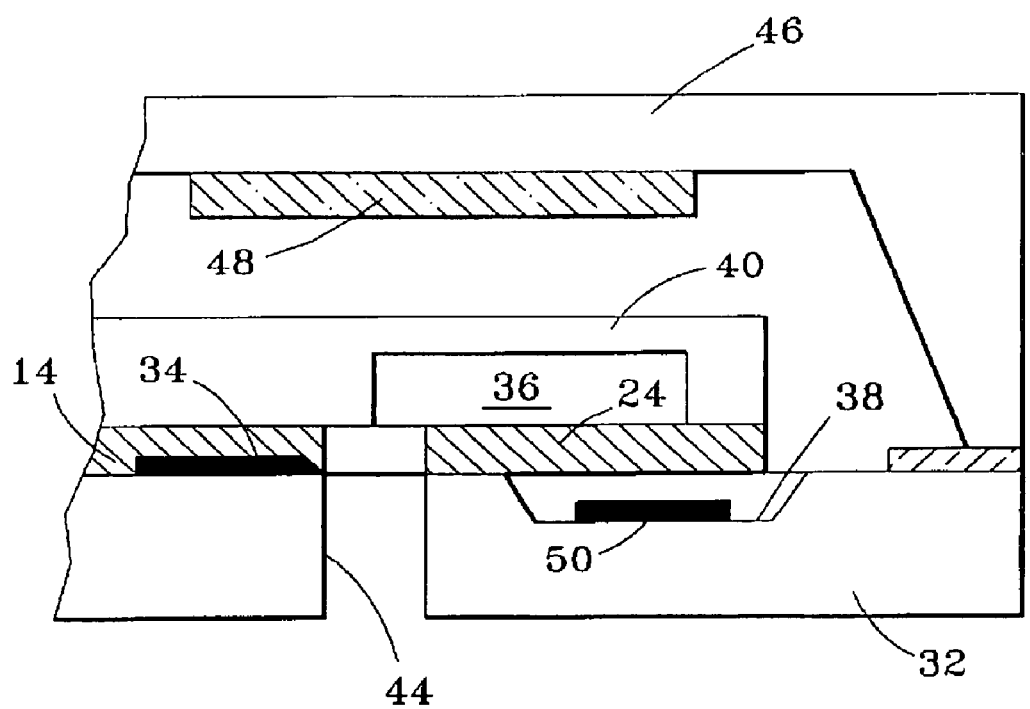
FIG. 9 depicts the result of bonding a capping wafer to the substrate to enclose the tube.

Finally, FIG. 9 shows the result of bonding a capping wafer 46 to the substrate 32 to enclose the tube 40, preferably vacuum sealing the tube 40 between the substrate 32 and capping wafer 46 in order to enhance the dynamic performance of the tube 40 if the tube 40 is desired to vibrate in accordance with U.S. Pat. Nos. 6,477,901 and 6,647,778. As evident from FIG. 9, the capping wafer 46 must be thicker than the tube 40, so for a full wafer-thickness tube 40, a special thick wafer must be employed for the capping wafer 46. The capping wafer 46 is shown as having an integrated getter 48 to improve vacuum quality. Sealing of the capping wafer 46 to the substrate 32 can be by glass frit sealing, eutectic bonding, solder bonding, anodic bonding, or other bonding technique known in the art. The capping wafer 46 can be formed of a silicon, glass, or other material known and used for this purpose. Alternatively, this step can be omitted if an acceptable vacuum can be formed without wafer-to-wafer bonding.

While the invention has been described in terms of a particular embodiment, it is apparent that other forms could be adopted by one skilled in the art. Therefore, the scope of the invention is to be limited only by the following claims.

What is claimed is:

1. A process of fabricating a micromachined tube for fluid flow therethrough, the process comprising the steps of:
   providing a first material having a thickness throughout which the first material is substantially uniformly doped;
   etching a channel in a first portion of the first material in a direction of the thickness thereof, the channel extending through more than half but not entirely through the thickness of the first material, the channel being between second and third portions of the first material;
   bonding the first material to a second material so that a first portion of the second material overlies the first portion of the first material and encloses the channel therein to define a passage, and so that second and third portions of the second material overlie the second and third portions of the first material;
   removing the second and third portions of the second material and some but not all of the second and third portions of the first material underlying the second and third portions of the second material, such that the first portions of the first and second materials define a protrusion;
   bonding the first portion of the second material to a substrate adjacent a recess in a surface of the substrate such that a portion of the passage projects over the recess; and then
   removing the second and third portions of the first material such that the first portion of the first material and the passage therein define a tube, a freestanding portion of the tube projecting over the recess in the substrate so as to be capable of movement relative thereto.

2. The process according to claim 1, wherein the first material is a doped single-crystal wafer.

3. The process according to claim 1, wherein the second material is chosen from the group consisting of an epitaxial layer on a wafer, a silicon-on-insulator wafer, and a doped single-crystal wafer.

4. The process according to claim 1, wherein the first and second materials are both doped either n-type or p-type.

5. The process according to claim 1, wherein the first and second materials both comprise silicon.

6. The process according to claim 1, wherein the channel extends through about 75% to about 90% of the thickness of the first material.

7. The process according to claim 1, wherein the channel is formed by an anisotropic etching technique.

8. The process according to claim 1, wherein the channel is formed by a plasma etching technique.

9. The process according to claim 1, wherein the second material is a doped epitaxial layer on a more lightly-doped wafer.

10. The process according to claim 9, further comprising the step of removing the more lightly-doped wafer so as to leave only the second material before bonding the first material to the second material.

11. The process according to claim 10, wherein the more lightly-doped wafer is removed by an etching technique in which the second material serves as an etch stop.

12. The process according to claim 1, wherein the second and third portions of the second material and some but not all of the second and third portions of the second material channel is removed by masking the first portion of the second material and then etching the second and third portions of the second material exposed by the masking step followed by etching the second and third portions of the first material underlying the second material.

13. The process according to claim 1, wherein the second and third portions of the first material are etched to a depth of less than half the thickness of the first material.

14. The process according to claim 1, wherein bonding the first portion of the second material to the substrate results in the second material making electrical contact with a metal runner on the substrate.

15. The process according to claim 1, wherein the second and third portions of the first material are removed by a deep reactive ion etching technique.

16. The process according to claim 1, further comprising the step of vacuum sealing the tube between the substrate and a capping wafer.

17. The process according to claim 1, further comprising the step of forming holes in the substrate that fluidically interconnect with opposite ends of the tube to define a fluid inlet and a fluid outlet of the tube.

18. The process according to claim 1, further comprising the step of forming on the substrate means for vibrating the freestanding portion of the tube at a resonant frequency thereof and means for sensing movement of the freestanding portion of the tube relative to the substrate.

19. A process of fabricating a micromachined tube of a microfluidic device, the process comprising the steps of:
- providing a first doped material having a thickness throughout which the first doped material is substantially uniformly doped;
- anisotropically etching a channel in a first portion of the first doped material in a direction of the thickness thereof, the channel extending through more than half but not entirely through the thickness of the first doped material, the channel being between second and third portions of the first doped material;
- bonding the first doped material to a second doped material so that a first portion of the second doped material overlies the first portion of the first doped material and encloses the channel therein to define a passage, and so that second and third portions of the second doped material overlie the second and third portions of the first doped material;
- masking the first portion of the second doped material;
- etching the second and third portions of the second doped material exposed by the masking step followed by etching some but not all of the second and third portions of the first doped material, such that the first portions of the first and second doped materials define a protrusion;
- bonding the first portion of the second doped material to a substrate adjacent a recess in a surface of the substrate such that a portion of the passage projects over the recess and the second doped material makes electrical contact with an electrical conductor on the substrate; and then
- removing the second and third portions of the first doped material such that the first portion of the first doped material and the passage therein define a tube, a freestanding portion of the tube projecting over the recess in the substrate so as to be capable of movement relative thereto.

20. The process according to claim 19, further comprising the steps of:
- forming on the substrate means for vibrating the freestanding portion of the tube at a resonant frequency thereof and means for sensing movement of the freestanding portion of the tube relative to the substrate;
- vacuum sealing the tube between the substrate and a capping wafer; and
- forming holes in the substrate that fluidically interconnect with opposite ends of the tube to define a fluid inlet and a fluid outlet of the tube.

\* \* \* \* \*